US007290943B2

(12) United States Patent
Murry

(10) Patent No.: US 7,290,943 B2
(45) Date of Patent: *Nov. 6, 2007

(54) MODULAR LASER PACKAGE SYSTEM AND ASSOCIATED METHODS

(76) Inventor: Stefan J. Murry, 5719 Indigo, Houston, TX (US) 77096

( * ) Notice: Subject to any disclaimer, the term of this patent is extended or adjusted under 35 U.S.C. 154(b) by 0 days.

This patent is subject to a terminal disclaimer.

(21) Appl. No.: 11/162,374

(22) Filed: Sep. 8, 2005

(65) Prior Publication Data

US 2007/0036495 A1 Feb. 15, 2007

Related U.S. Application Data

(60) Provisional application No. 60/595,880, filed on Aug. 12, 2005.

(51) Int. Cl.
G02B 6/36 (2006.01)

(52) U.S. Cl. .......................................... 385/92; 385/14

(58) Field of Classification Search ................... 385/92
See application file for complete search history.

(56) References Cited

U.S. PATENT DOCUMENTS

| 4,399,541 | A | * | 8/1983 | Kovats et al. ................. 372/36 |
| 5,068,865 | A | * | 11/1991 | Ohshima et al. ............... 372/36 |
| 5,227,646 | A | * | 7/1993 | Shigeno ......................... 257/80 |
| 5,399,858 | A | * | 3/1995 | Kinoshita ..................... 250/239 |
| 6,023,542 | A | * | 2/2000 | Pan et al. ....................... 385/24 |
| 6,198,858 | B1 | * | 3/2001 | Pan et al. ....................... 385/24 |
| 2003/0026557 | A1 | * | 2/2003 | Galeotti et al. ................ 385/94 |
| 2003/0178615 | A1 | * | 9/2003 | Sato ................................ 257/9 |
| 2005/0018994 | A1 | * | 1/2005 | Riaziat et al. ............... 385/147 |
| 2005/0036535 | A1 | * | 2/2005 | Knopp et al. ................ 372/108 |
| 2006/0165353 | A1 | * | 7/2006 | Miao et al. .................... 385/88 |

* cited by examiner

*Primary Examiner*—Hemang Sanghavi
*Assistant Examiner*—Kajli Prince
(74) *Attorney, Agent, or Firm*—N. Stephan Kinsella; Grossman, Tucker, Perreault & Pfleger

(57) ABSTRACT

A modular laser assembly has a laser-fiber housing comprising a semiconductor laser optically coupled to an end of an optical fiber, the laser-fiber housing having electrical leads electrically coupled to the laser and extending from a front face of the laser-fiber housing; a mounting platform comprising laser interfacing circuitry and contacts electrically coupled thereto, an opening for receiving the laser-fiber housing wherein when the laser-fiber housing is mounted to the mounting platform the electrical leads are proximate and may be electrically coupled to the contacts, and a plurality of pins electrically coupled to the interfacing circuitry and extending laterally from opposing sides of the mounting platform; and a temperature controlling element for mounting to and controlling the temperature of the laser-fiber housing.

8 Claims, 1 Drawing Sheet

MODULAR LASER PACKAGE SYSTEM AND ASSOCIATED METHODS

CROSS-REFERENCE TO RELATED APPLICATIONS

This nonprovisional U.S. national application, filed under 35 U.S.C. § 111(a), claims, under 37 C.F.R. § 1.78(a)(4)-(5) and 35 U.S.C. § 119(e)(1), the benefit of the filing date of provisional U.S. national application No. 60/595,880, filed under 35 U.S.C. § 111(b) and accorded a filing date of Aug. 12, 2005, the entirety of which is incorporated herein by reference.

BACKGROUND OF THE INVENTION

1. Field of the Invention

This invention relates to laser packaging and, in particular, to apparatuses and methods for controlling the temperature of and electrically interfacing a laser with external circuitry.

2. Description of the Related Art

The following descriptions and examples are not admitted to be prior art by virtue of their inclusion within this section.

There are several types of lasers, including gas lasers, solid-state lasers, liquid (dye) lasers, free electron, and semiconductor lasers. All lasers have a laser cavity defined by at least two laser cavity mirrors, and an optical gain medium in the laser cavity. The gain medium amplifies electromagnetic waves (light) in the cavity by stimulated emission, thereby providing optical gain.

In semiconductor lasers, a semiconductor active region serves as the gain medium. Semiconductor lasers may be edge-emitting lasers or surface-emitting lasers (SELs). Edge-emitting semiconductor lasers output their radiation parallel to the wafer surface, in contrast to SELs, in which the radiation output is perpendicular to the wafer surface, as the name implies.

Semiconductor lasers are used in a variety of applications, such as high-bit-rate optical fiber communications. In telecommunications applications, the laser often emits at a single lasing wavelength at 1.31 µm (and other closely spaced wavelengths), or at telecommunications wavelengths specified by the ITU grid, such as lasing wavelengths of 1.55 µm (and other closely spaced wavelengths). These wavelength ranges are often used for telecommunications purposes because the loss of silica fibers is comparatively low at these wavelengths.

Lasers must be optically coupled to fibers to engage in optical fiber communications. For example, a 1.31 µm edge-emitting laser's output must be optically coupled into the input (light-receiving) end of an optical fiber in order to transmit a modulated optical signal via the fiber.

Various modules, assemblies or packages are used to hold the laser, other optical components (such as collimation and coupling lenses, isolators, and the like), and optical fiber while being aligned with each other so as to permit the laser to be optically coupled to the fiber, i.e. light output from the laser is transmitted into the fiber. The process of aligning an optical fiber to a laser diode and fixing it in place is sometimes known as fiber pigtailing. Various laser packages (housings) are employed to align and position the laser, fiber, and related optical components to each other so the laser is optically coupled to the fiber. The housing may include intermediate optical components such as one or more lenses, isolators, and the like. The standard laser package housing types include TO (transistor outline) can and butterfly packages.

For example, the laser (usually a laser diode) and the light-receiving end of the optical fiber to which the laser is to be optically coupled may be mounted together in a TO can housing. The laser is mounted on a laser submount on the TO can post of the TO header. The fiber end may be disposed in a rigid cylindrical ferrule, which is itself mounted inside a cylindrical ferrule housing. The TO header has a substantially cylindrical portion having a lens disposed in an opening in the top portion thereof, in the TO cap, which can be disposed between the laser and the fiber end. The fiber ferrule housing is mounted to the TO can. The TO can housing may also include other related components, such as a lens and a monitor photodiode, and is typically hermetically sealed.

In metal boxlike housings (packages) such as butterfly housings, the laser and related components are mounted on a platform such as an optical bench. These related components may include laser circuitry including signal conditioning and impedance matching circuits, and a temperature sensor. The laser and laser circuitry are electrically connected to some of the 7×2 pins extending laterally from the housing. The optical bench may be mounted on a temperature stabilizing (thermal stabilization) means comprising a heat radiating element such as a Peltier effect element, i.e. a thermoelectric cooler, or TEC, inside the boxlike housing. In one approach, there is an opening in an end sidewall of the housing, through which is inserted a metal pipe (ferrule). The fiber is inserted through the ferrule into the inside of the housing, and soldered to the metal ferrule for a sealed fit. Disposed on the platform between the laser and the input end of the fiber are typically components such as collimating lens, isolator, and one or more lenses.

When a metal butterfly housing is employed, a diode laser chip on submount is typically mounted onto an optical bench in the housing. The butterfly housing is to be hermetically sealed and will contain the laser and associated optics. The optical bench may itself be mounted on a TEC inside the laser housing. The TEC is used to control the temperature of the diode laser to permit higher performance and/or operation over a greater power range. For these and other reasons, butterfly housings are typically much more expensive than TO can housings and are generally used for higher performance applications.

The butterfly housing may be mounted onto a larger circuit board, sometimes referred to as a transmitter board or motherboard, which contains external circuitry (such as drive circuitry and other circuitry) and a heatsink in contact with the TEC. The transmitter board contains a mating section designed to receive the butterfly housing. The mating section may be, for example, a rectangular opening in the transmitter board having contact points on the upper surface of the board, around the opening, located so as to be in contact with the 7×2 pins extending from the butterfly housing when it is lowered into the opening so that the pins are flush with the upper surface of the transmitter board. A heatsink is mounted to the TEC which extends through the opening.

BRIEF SUMMARY OF THE INVENTION

A modular laser assembly having a laser-fiber housing comprising a semiconductor laser optically coupled to an end of an optical fiber, the laser-fiber housing having electrical leads electrically coupled to the laser and extending from a front face of the laser-fiber housing; a mounting platform comprising laser interfacing circuitry and contacts electrically coupled thereto, means for receiving the laser-fiber housing wherein said laser-fiber housing is mounted to the mounting platform the electrical leads are proximate and may be electrically coupled to the contacts, and a plurality of pins electrically coupled to said interfacing circuitry and extending laterally from opposing sides of the mounting platform; and a temperature controlling means for mounting to and controlling the temperature of the laser-fiber housing.

BRIEF DESCRIPTION OF THE SEVERAL VIEWS OF THE DRAWING

Other features and advantages of the invention will become apparent upon study of the following description, taken in conjunction with the attached FIGS. 1-3.

DETAILED DESCRIPTION OF THE INVENTION

Figure 1:
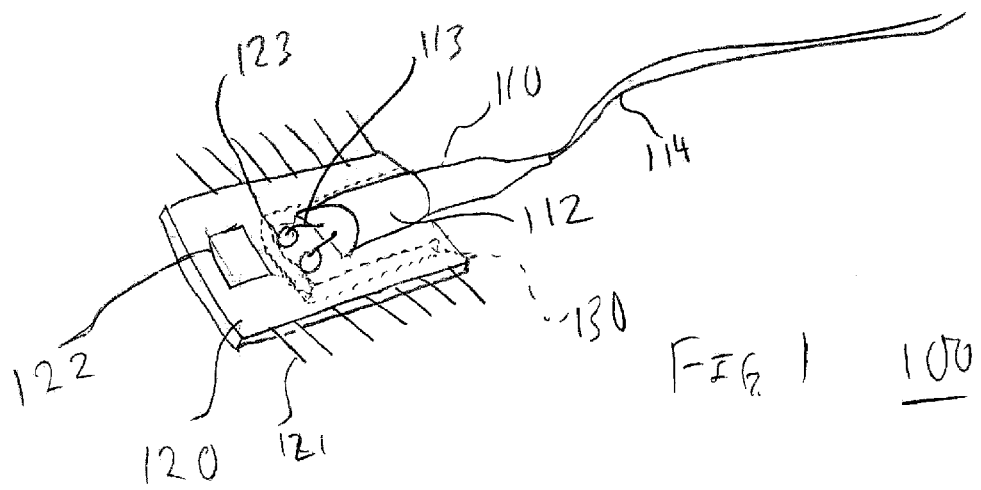
FIG. 1 is a perspective view of a modular laser package assembly, in accordance with an embodiment of the invention.
Figure 2:
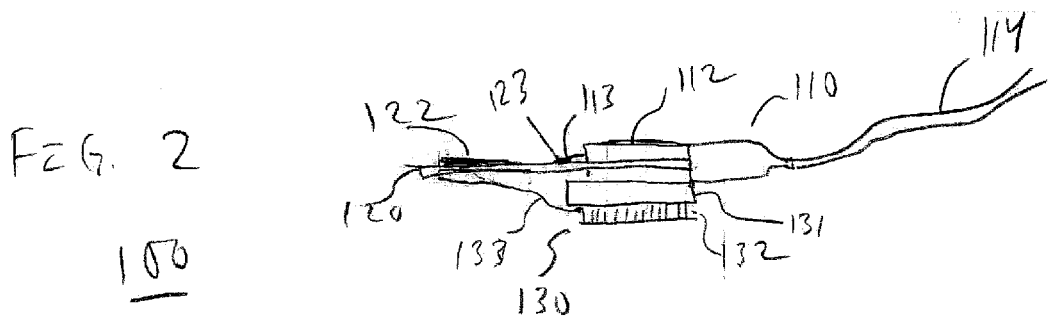
FIG. 2 is a side view of the modular laser package assembly of FIG. 1.
Figure 3:
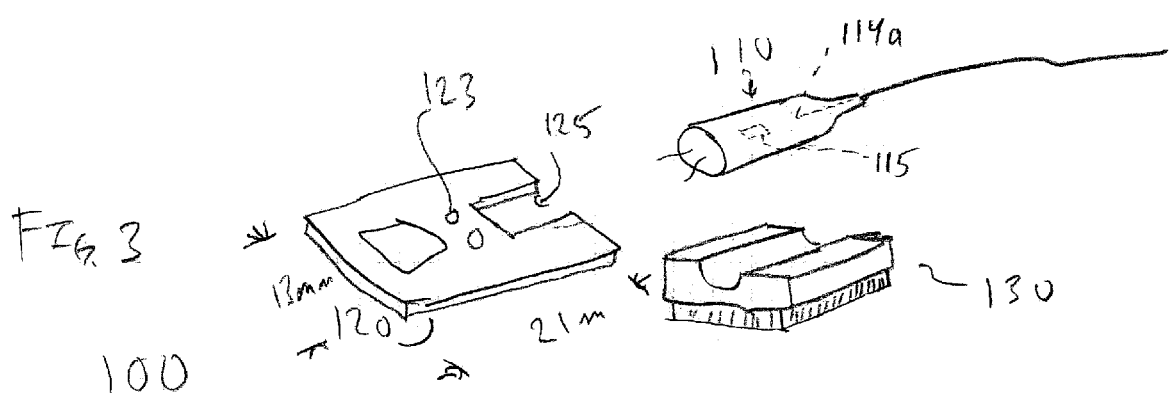
FIG. 3 is an exploded perspective view of the modular laser package assembly of FIG. 1.

Referring now to FIG. 1, there is shown a perspective view of a modular laser package assembly or system 100, in accordance with an embodiment of the invention. Side and exploded views of assembly 100 are illustrated in FIGS. 2 and 3, respectively. Modular laser assembly 100 comprises three primary modules: a laser-fiber housing 110, a circuit board mounting platform 120, and temperature-controlling means or element such as TEC 130.

Laser-fiber housing 110 includes a laser 115 mounted therein which is optically coupled to an end 114a of fiber 114, which is also disposed and mounted within the housing 110. Electrical leads 113 coupled to the laser 115 extend from a front face of housing 110. Drive circuitry coupled directly or indirectly to leads 113 is used to modulate laser 115 to transmit a modulated laser signal into end 114a of fiber 114. Housing 110 preferably also includes other components, including a lens and a monitor photodiode, and is hermetically sealed. In an embodiment, housing 110 is has a substantially cylindrical body portion 112, such as a TO can housing.

Circuit board mounting platform 120 comprises laser interfacing circuitry 122 and pins 121, which are electrically coupled to laser interfacing circuitry 122 and which extend laterally from opposing sides of the mounting platform. Platform 120 comprises a means for receiving and mounting laser-fiber housing 110. In an embodiment, the means for receiving laser-fiber housing 110 comprises a slot or opening 125, illustrated in FIG. 3, which is adapted to receive and is for mounting housing 110. When laser-fiber housing 110 is mounted to the mounting platform 120 in opening 125, the electrical leads 113 are proximate and may be electrically coupled (e.g., by solder) to contacts 123 on the upper surface of platform 120 and thus to interfacing circuitry 122 and pins 121. Pins 121 may be coupled to external drive circuitry, so that the drive circuitry is coupled via the intermediate interfacing circuitry 122 to leads 113 and laser 115.

Laser interfacing circuitry 122 comprises various circuits or circuit means for conditioning or modifying the electrical signals applied to laser 115, and/or for interfacing with external devices. For example, circuitry 122 in an embodiment comprises impedance matching circuits for impedance matching the laser to typical drive circuits, which is typically external to the packaged laser assembly 100. Circuitry 122 may also include signal conditioning circuits that condition the signals being applied to laser 115. In alternative embodiments, circuitry 122 may include drive or other circuitry.

A temperature controlling means for mounting to and controlling the temperature of the laser-fiber housing 110, such as TEC 130, is mounted to the outside of housing 110 so as to control the temperature of housing 110 and its internal components, including laser 115. TEC 130 is preferably mounted parallel and adjacent the bottom surface of platform 120.

In an embodiment, as illustrated, contacts 123 and interfacing circuitry 122 are disposed on a top surface of the mounting platform, so that the top and bottom surfaces of mounting platform 120 are parallel to the pins 113, and the pins 113 extend from opposing ends or end surfaces surfaces of the mounting platform that are perpendicular to the top and bottom surfaces and substantially parallel to the axis of the cylindrical laser-fiber housing.

The dimensions of platform 120 and the orientation, number, and dimension of pins 121 extending therefrom (7×2), combined with the size and orientation of TEC 130 as mounted to housing 110 when mounted in slot 125, are preferably such that the pins and TEC 130 are oriented so as to be compatible with a standard butterfly package housing.

As is known by those skilled in the art, a standard butterfly package housing typically has approximately the following dimensions: a boxlike housing section having a length of about 21 mm, a width of about 13 mm, and a height of about 10 mm; with 7 pins extending from each of the opposing longest sides, each pin being about 13 mm long, 0.5 mm wide, and spaced about 2.5 mm apart. A laser packaged in such a standard butterfly housing may be mounted onto other devices designed to mate with such a housing, such as a transmitter board, as noted above.

Therefore, in the present invention, the dimensions of assembly or system 100 and its constituent modules or components are sufficiently similar to those of a standard butterfly housing so that modular laser assembly 100 may be mounted on other devices that would also physically mate with a standard butterfly housing.

For example, laser assembly 100 may be mounted onto the same transmitter board (and heat sink) that is designed to physically receive a standard butterfly package housing; the pins 121 have similar length, size, spacing, and location with respect to the overall assembly 100 so that when assembly 100 is mounted placed in the rectangular opening of the laser mating section of a transmitter board (for example) so that the pins 121 are flush with the upper surface, a heat sink may be mounted from the bottom of the transmitter board onto TEC 130 and pins 121 are in contact with (and may be soldered to) corresponding contacts on the upper surface of the transmitter board adjacent the opening.

In this manner, a temperature-stabilized laser may be provided having lower cost than a butterfly laser but compatible with standard butterfly-compatible receiving devices, such as transmitter boards and associated heat sinks designed to mount to butterfly packaged lasers and such transmitter boards. Assembly 100 also has higher performance than a non-cooled standard TO can laser, since laser 115 is temperature stabilized.

In addition, by having a modular system, it is easier to modify the system's features and specifications by selecting the appropriate component. For example, a different TEC cooler may be employed with the same laser-fiber housing 110 and platform 120. Likewise, a different laser may be used by simply selecting a different already-assembled laser-fiber housing. The laser interfacing circuitry 122 (e.g., impedance matching and signal conditioning circuits) on the circuit board platform 130 may be changed by selecting a different circuit board.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. A modular laser assembly comprising:
   a laser-fiber housing comprising a semiconductor laser optically coupled to an end of an optical fiber, the laser-fiber housing having electrical leads electrically coupled to the laser and extending from a front face of the laser-fiber housing, wherein the laser-fiber housing is compatible for mounting onto a mating section of a circuit board but is not compatible for mounting onto a mating section of a circuit board designed to mate with a butterfly package housing and wherein the laser-fiber housing is substantially cylindrical;
   a mounting platform comprising laser interfacing circuitry and contacts electrically coupled thereto, said mounting platform defining a slot for receiving the laser-fiber housing such that a portion of the laser-fiber housing extends to one side of the mounting platform and a portion of the laser-fiber housing extends to an opposite side of the mounting platform, wherein when said laser-fiber housing is mounted to the mounting platform the electrical leads are proximate and capable of being electrically coupled to the contacts on at least a first surface of the mounting platform, and a plurality of pins electrically coupled to said interfacing circuitry and extending laterally from opposing sides of the mounting platform;
   a temperature-controlling element for coupling to and controlling the temperature of the laser-fiber housing, wherein the temperature-controlling element is configured to be mounted to the laser-fiber housing such that the temperature-controlling element is substantially parallel to and adjacent a second surface of the mounting platform, and wherein the temperature-controlling element includes electrical leads capable of being electrically coupled to contacts on the second surface of the mounting platform; and
   wherein the dimensions of the mounting platform and the orientation, number, and dimension of the pins extending therefrom, and the dimensions of the laser-fiber housing and the temperature-controlling element are such that the modular laser assembly is compatible for mounting onto a mating section of a circuit board designed to mate with a butterfly package housing.

2. The modular laser assembly of claim 1, wherein the laser-fiber housing is a TO can housing.

3. The modular laser assembly of claim 1, wherein the interfacing circuitry further comprises drive circuitry.

4. The modular laser assembly of claim 1, wherein the pins comprise two parallel sets of seven pins.

5. The modular laser assembly of claim 4, wherein the pins are each approximately 13 mm long and approximately 0.5 mm wide, wherein the pins of each parallel set of seven pins are spaced about 2.5 mm apart.

6. The modular laser assembly of claim 5, wherein the mounting platform is approximately 21 mm long and approximately 13 mm wide.

7. The modular laser assembly of claim 1, wherein the temperature-controlling element is a thermo-electric cooler (TEC).

8. The modular laser assembly of claim 1, wherein: the interfacing circuitry is disposed on the surface of the mounting platform; the laser-fiber housing is substantially cylindrical; and the first and second surfaces are parallel to the pins and the pins extend from opposing end surfaces of the mounting platform that are perpendicular to the first and second surfaces and substantially parallel to the axis of the laser-fiber housing.

* * * * *